United States Patent

Noda et al.

[11] Patent Number: 5,998,856
[45] Date of Patent: Dec. 7, 1999

[54] SEMICONDUCTOR DEVICE

[75] Inventors: Sukehisa Noda; Shinji Yamada; Tooru Iwagami; Seiki Iwagaki; Hisashi Kawafuji, all of Tokyo, Japan

[73] Assignee: Mitsubishi Denki Kabushiki Kaisha, Tokyo, Japan

[21] Appl. No.: 09/117,172
[22] PCT Filed: Nov. 28, 1996
[86] PCT No.: PCT/JP96/03495
   § 371 Date: Jul. 28, 1998
   § 102(e) Date: Jul. 28, 1998
[87] PCT Pub. No.: WO98/24128
   PCT Pub. Date: Jun. 4, 1998
[51] Int. Cl.⁶ .................................................. H01L 23/495
[52] U.S. Cl. ..................... 257/666; 257/723; 257/724; 257/677
[58] Field of Search ................................. 257/666, 723, 257/787, 691, 724, 692, 677

[56] References Cited

U.S. PATENT DOCUMENTS

| 5,598,038 | 1/1997 | Sugano . |
| 5,767,567 | 6/1998 | Hu et al. . |
| 5,767,573 | 6/1998 | Noda et al. . |

FOREIGN PATENT DOCUMENTS

| 3-188661 | 8/1991 | Japan . |
| 5-29539 | 2/1993 | Japan . |
| 5-206365 | 8/1993 | Japan . |
| 5-299576 | 11/1993 | Japan . |
| 6-9152 | 2/1994 | Japan . |
| 6-277775 | 10/1994 | Japan . |
| 7-50384 | 2/1995 | Japan . |
| 7-161905 | 6/1995 | Japan . |

Primary Examiner—Shiela V. Clark
Attorney, Agent, or Firm—Oblon, Spivak, McClelland, Maier & Neustadt, P.C.

[57] ABSTRACT

The present invention relates to a semiconductor device, and more particularly, it aims at providing a semiconductor device which is excellent in workability of assembly and reduces the assembly cost in a semiconductor device packaging a power device and a control device controlling this power device.

In order to attain the aforementioned object, it shows a lead frame (10) before mounting a power device (PD) and a control device (CD), and a region where a gold wire (W2) is arranged and a region where the power device (PD) is arranged are silver-plated regions (A). Further, a region where an aluminum wire (W1) is arranged is a nickel-plated region (B). Further, a power device die pad (1A) is connected to a tie bar (5) and a frame (6) by suspension leads (40 to 45), and supported in three directions. Further, an intermediate lead (3A to 3D) is formed in the vicinity of the control device (CD).

6 Claims, 6 Drawing Sheets

SEMICONDUCTOR DEVICE

TECHNICAL FIELD

The present invention relates to a semiconductor device, and more particularly, it relates to a semiconductor device packaging power devices and a control device controlling these power devices.

BACKGROUND TECHNIQUE

FIG. 6 shows a semiconductor device described in Japanese Patent Laying-Open Gazette No. 5-299576. The semiconductor device 90 shown in FIG. 6 has a structure of storing power devices and IC-ed control devices controlling these power devices in the same package, and is called a multi-chip type semiconductor device.

In FIG. 6, external leads 23 having power chip mounting regions 23a for mounting power chips 26 and control chip mounting regions 33a mounting control chips 27 extend from oppositely arranged two lead frames 31.

The power chips 26 and the control chips 27 are electrically connected with the external leads extending from the lead frames 31 by aluminum wires 28 and gold wires 29 respectively. It comes to that the power chips 26 and the control chips 27 are sealed with outer packaging resin 101 which is formed on a region enclosed with one-dot chain lines shown in FIG. 6.

At this point, electrical connection between the power chips 26 and the control chips 27 and the external leads is performed by wire bonding. In the wire bonding, reliable bonding cannot be performed unless the material for the wires and the material for the parts to which these wires are connected are properly combined with each other.

Namely, at least connecting portions must be of nickel in the external leads connecting the aluminum wires 28, and at least connecting portions must be of silver in the external leads connecting the gold wires 29. Since the lead frames 31 are made of copper in general, nickel plating and silver plating have been performed on the parts to which the aluminum wires 28 and the gold wires 29 are connected.

At this point, the parts to which the aluminum wires 28 and the gold wires 29 are connected have been intermixed with each other as shown in FIG. 6, and hence nickel plating and silver plating have been performed by spot plating locally performing plating.

In order to perform spot plating, a copper plate serving as the material is worked by punching for forming a lead frame and thereafter covering a part not to be plated with a mask for performing plating only on an opening part, while the shape of the mask is complicated and a step of sticking the mask to the lead frame is troublesome, and hence there have been such problems that workability of assembly is inferior and the assembly, cost is high.

As shown in FIG. 6, the power chip mounting regions 23a and the control chip mounting regions 33a have been in structures connected to the lead frames 31 in single directions. Therefore, the same are in cantilevered states and readily deformed if excess force is applied, and hence there have been such problems that bonding operations for the power chips 26 and the control chips 27 and an operation for transporting the lead frames 31 after wire-bonding the aluminum wires 28 and the gold wires 29 are not easy, operability is inferior and the assembly cost is high. In recent years, enlargement of an IPM progresses, and particularly power chips enlarge and the weight also tends to get heavy. In such circumstances, it prompts the aforementioned problems that the power chip mounting regions and the control chip mounting regions, particularly the power chip mounting regions are in cantilevered structures, and hence becomes an important subject.

Thus, in the conventional semiconductor device, there have been such problems that workability of assembly is inferior since spot plating has been performed in the connecting portions in case of connecting the aluminum wires and the gold wires with the external leads, and the assembly cost is high.

Further, the power chip mounting regions and the control chip mounting regions have been in cantilevered states, and hence there have been such problems that workability of assembly is inferior and the assembly cost is high.

DISCLOSURE OF THE INVENTION

The present invention aims at solving the aforementioned problems, and providing a semiconductor device which is excellent in workability of assembly and reduces the assembly cost.

A first aspect of the semiconductor device according to the present invention comprises a lead frame, a power device and a control device controlling the said power device, arranged on the said lead frame, the said power device is arranged in a first region on the said lead frame, the said control device is arranged in a second region on the said lead frame, the said first region and the said second region are divided without being intermixed with each other, the said power device is electrically connected with the said lead frame in the said first region through a first wire, the said control device is electrically connected with the said lead frame in the said second region through a second wire which is thinner than the said first wire, and the said lead frame is such that at least a region to which the said first wire is connected is a striped first plating region subjected to plating of a first material with a constant width along a prescribed direction of the said lead frame and at least a region to which the said second wire is connected is a striped second plating region subjected to plating of a second material with a constant width along the said prescribed direction of the said lead frame.

According to the first aspect of the inventive semiconductor device, formation of the striped plating regions becomes possible by dividing the first region and the second region without intermixing the same with each other, for forming the striped first plating region at least on the region of the lead frame to which the first wire is connected and forming the striped second plating region at least on the region to which the second wire is connected, whereby spot plating causing reduction of workability and increase of the assembly cost becomes unnecessary in case of connecting the first wire and the second wire, and a semiconductor device which is excellent in workability of assembly and reduces the assembly cost can be obtained.

A second aspect of the semiconductor device according to the present invention is such that the said lead frame is an integrated lead frame formed by applying a prescribed lead pattern on plates of the same thickness and the same material.

According to the second aspect of the inventive semiconductor device, the integrated lead frame is employed, whereby a semiconductor device which is easy in assembly operation and reduces the assembly cost can be obtained.

A third aspect of the semiconductor device according to the present invention is such that the said first and second plating regions are formed before formation of the said prescribed lead pattern.

According to the third aspect of the inventive semiconductor device, it comes to that, when the material for the lead frame is roll-shaped, for example, the shapes of masks are simple and sticking of the masks is easy while plating is performed over a wide range by applying striped masks over the entire region of a roll material and forming prescribed striped plating regions, whereby workability is also excellent and the cost can be lowered.

A fourth aspect of the semiconductor device according to the present invention is such that the said lead frame comprises an intermediate lead which is independent of a lead performing electrical connection between the said power device and the said control device and the device exterior, and the said intermediate lead serves as a path through which another end of the said first wire whose one end is connected to the said control device and another end of the said second wire whose one end is connected to the said power device are connected with each other for electrically connecting the control device and the power device with each other.

According to the fourth aspect of the inventive semiconductor device, the length of the first wire can be shortened by comprising the intermediate lead if the intermediate lead is provided to form a bypass path for avoiding arrangement of the first wire over a long distance, whereby workability of wire bonding becomes excellent. When the intermediate lead is formed to avoid overhead crossing of the first wire, contact of the first wire by overhead crossing can be prevented and defective products can be reduced, while workability of wire bonding becomes excellent.

A fifth aspect of the semiconductor device according to the present invention is such that the said lead frame comprises at least one power device die pad mounting the said power device and at least one control device die pad mounting the said control device, and the said at least one power device die pad and at least one said control device die pad further comprise suspension leads connecting the said at least one power device die pad and at least one said control device die pad to the said lead frame and supporting the same in addition to leads originally comprised for connecting the respective ones and the said lead frame.

According to the fifth aspect of the inventive semiconductor device, at least one power device die pad and at least one control device die pad are supported by the originally comprised leads and the suspension leads, whereby support strength for at least one power device die pad and at least one control device die pad increases, deflection is prevented in case of mounting, the power device and the control device, bonding operations for the power device and the control device and a transport operation after wire bonding of the first and second wires become easy, and improvement of the workability and reduction of the assembly cost can be achieved.

A sixth aspect of the semiconductor device according to the present invention is such that the said lead frame comprises four frames defining a rectangular region, the said at least one power device die pad is a plurality of power device die pads which are arranged in a line, and a power device die pad positioned on an end portion among the said plurality of power device die pads is connected to three among the said four frames by the said originally comprised leads and the said suspension leads.

According to the sixth aspect of the inventive semiconductor device, it comes to that it is supported by the lead frame in three directions as to the power device die pad positioned on the end portion among the plurality of power device die pads, whereby support strength increases, and deflection can be prevented by structuring the device to mount a plurality of power devices or mounting the largest power device on the power device die pad, for example.

BEST MODE FOR CARRYING OUT THE INVENTION

Embodiment 1-1. Structures of First and Second Characteristic Parts

As an embodiment of the semiconductor device according to the present invention, the structure of a module (Intelligent Power Module: hereinafter abbreviated as IPM) 100 storing a power device and an IC-ed control device controlling this power device in the same package is described with reference to plan views of FIG. 1 to FIG. 3.

Figure 1:
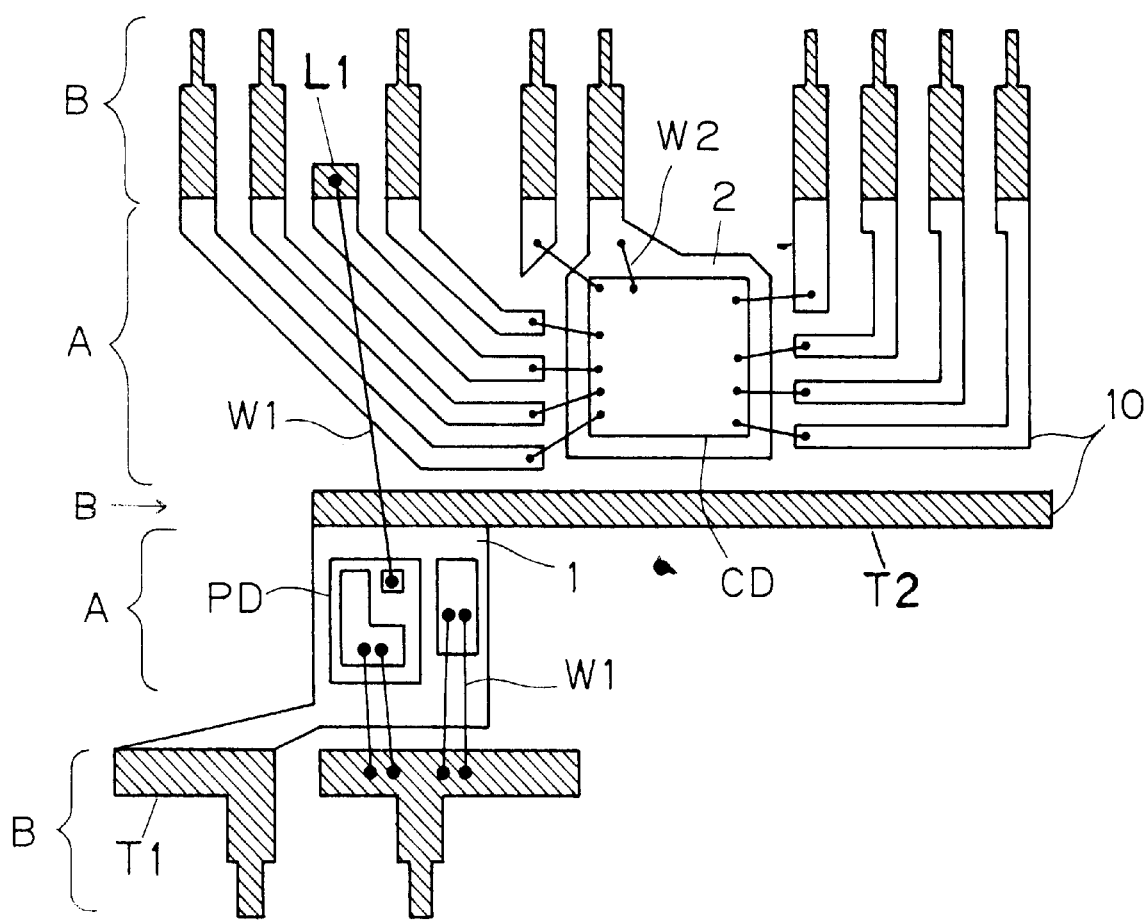
FIG. 1 is a diagram typically showing first and second characteristic parts according to the present invention.

FIG. 1 typically shows first and second characteristic parts of the IPM 100. FIG. 1 shows a state of fixing a power device PD and a control device CD to a lead frame 10 forming the IPM 100 by die bonding and performing wire bonding of aluminum wires W1 (first wires) and gold wires W2 (second wires).

As shown in FIG. 1, the lead frame 10 has a power device die pad 1 and a control device die pad 2, the power device PD is mounted on the power device die pad 1, and the control device CD is mounted on the control device die pad 2.

The power device die pad 1 and the control device die pad 2 are arranged on single sides of the lead frame 10 respectively. Namely, the power device die pad 1 is provided on a slightly lower side with reference to the plane center, and the control device die pad 2 is provided on a slightly upper side with reference to the plane center in FIG. 1

The power device PD is electrically connected with a prescribed portion on the lead frame 10 through the aluminum wires W1, the control device CD is electrically connected with a prescribed portion on the lead frame 10 through the gold wires W2, and packaging is completed. At this point, the device is so structured that the regions (first regions) where the aluminum wires W1 are arranged and the region (second region) where the gold wires W2 are arranged are not intermixed with each other.

At this point, silver plating is stripedly performed along overall regions in the region where the gold wires W2 are arranged and a region where the power device die pad 1 is arranged to define silver plating regions A (second plating regions), as the first characteristic part. Further, nickel plating is stripedly performed along the overall regions in the regions where the aluminum wires W1 are arranged, to define nickel plating regions B (first plating regions).

When defining nickel as "first material" at this point, the aforementioned silver corresponds to "second material".

As the second characteristic part, further, the power device die pad 1 is connected with the lead frame 10 in two directions in FIG. 1. Namely, the power device die pad 1 has a rectangular shape, and its one side is connected to a tie bar T1 of the lead frame 10, while another side is connected to a tie bar T2. At this point, the tie bar T2 is illustrated as being provided at a central portion of the lead frame 10, while the same is not structured in this way in practice, but this typically shows that the power device die pad 1 is connected to a tie bar which is independent of the tie bar T1.

Those shown as suspension leads 43, 44, 46 and 48 in FIG. 5 described later correspond to this.

1-2. Function/Effect by First and Second Characteristic Parts

Thus, the lead frame 10 is so formed that the regions where the aluminum wires W1 are arranged and the region where the gold wires W2 are arranged are not intermixed with each other and the gold wires W2 and the aluminum wires W1 are connected to the striped silver plating region A and the nickel plating regions B, whereby spot plating causing reduction of workability and increase of the assembly cost becomes unnecessary.

Further, the device is brought into the structure of connecting the power device die pad 1 with the lead frame 10 in two directions, whereby support strength for the power device die pad 1 increases, deflection is prevented in case of mounting the power device PD, a bonding operation for the power device WD and a transport operation after wire-bonding the aluminum wires W1 and the gold wires W2 become easy, and improvement of the workability and reduction of the assembly cost can be achieved.

1-3.Structure of Third Characteristic Part

In FIG. 1 showing the first and second characteristic parts of the IPM 100, such a structure that the aluminum wires W1 directly connect the nickel plating regions B and the power device PD with each other has been shown. Namely, the length of the aluminum wire W1 connecting the nickel plating region B of a lead L1 and the power device PD is longer than the remaining aluminum wires W1. The aluminum wires W1 are thicker than the gold wires W2, and assuming that the diameter of the gold wires W2 is 30 μm, for example, the diameter of the aluminum wires W1 is about 300 μm. Thus, there is no problem in strength even if the length of the aluminum wires W1 relatively lengthens, while the workability is excellent as the connection distance is reduced in such a viewpoint that vertical movement of a bonding tool or the distance of horizontal movement may be small in case of performing wire bonding.

Figure 2:
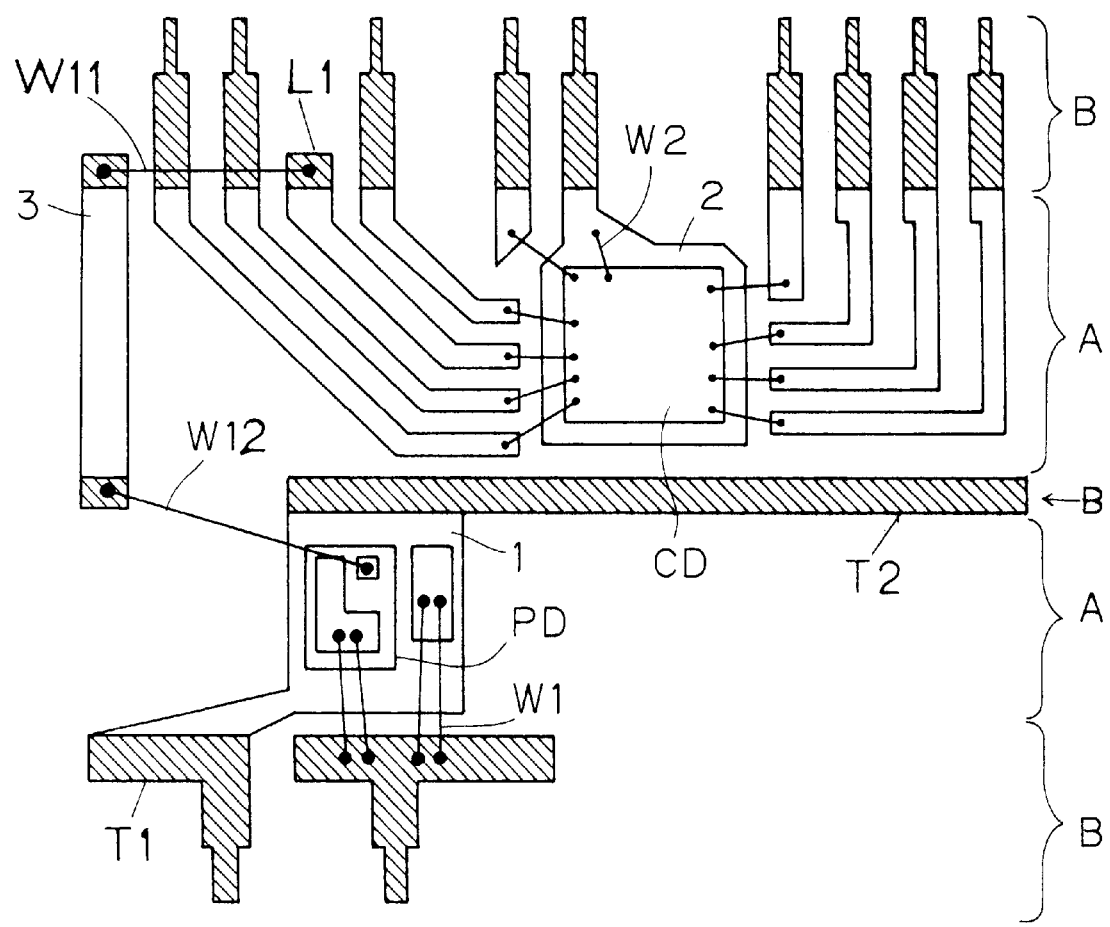
FIG. 2 is a diagram typically showing a third characteristic part according to the present invention.

FIG. 2 shows a third characteristic part of the IPM 100. In FIG. 2, the lead frame 10 has an intermediate lead 3, and the nickel plating region B of the lead L1 and the power device PD are electrically connected with each other by the intermediate lead 3 and aluminum wires W11 and W12.

In FIG. 2, both end portions of the intermediate lead 3 are nickel plating regions B, and the nickel plating region B of one end portion of the intermediate lead 3 and the nickel plating region B of the lead L1 are connected with each other by the aluminum wire W11, while the nickel plating region B on the other end portion of the intermediate lead 3 and the power device PD are connected with each other by the aluminum wire W12. In other words, the nickel plating region B of the lead L1 and the power device PD are electrically connected with each other through a bypass path formed by the intermediate lead 3 and the aluminum wires W11 and W12.

1-4. Function/Effect by Third Characteristic Part

By employing such a structure, the lengths of the aluminum wires W11 and W12 may be at degrees slightly longer as compared with the remaining aluminum wires W1, and the workability of wire bonding is excellent.

While the lead L1 directly connected to the control device CD and the intermediate lead 3 directly connected to the power device PD have been shown as independent individual structures in FIG. 2, an element integrating the lead L1 and the intermediate lead 3 may be referred to as an intermediate lead. In this case, that corresponding to the aluminum wire W11 becomes unnecessary.

The intermediate lead is not only used for reducing the lengths of the aluminum wires, but also used for avoiding overhead crossing of the aluminum wires.

2-1. Concrete Structural Example of IPM

Figure 3:
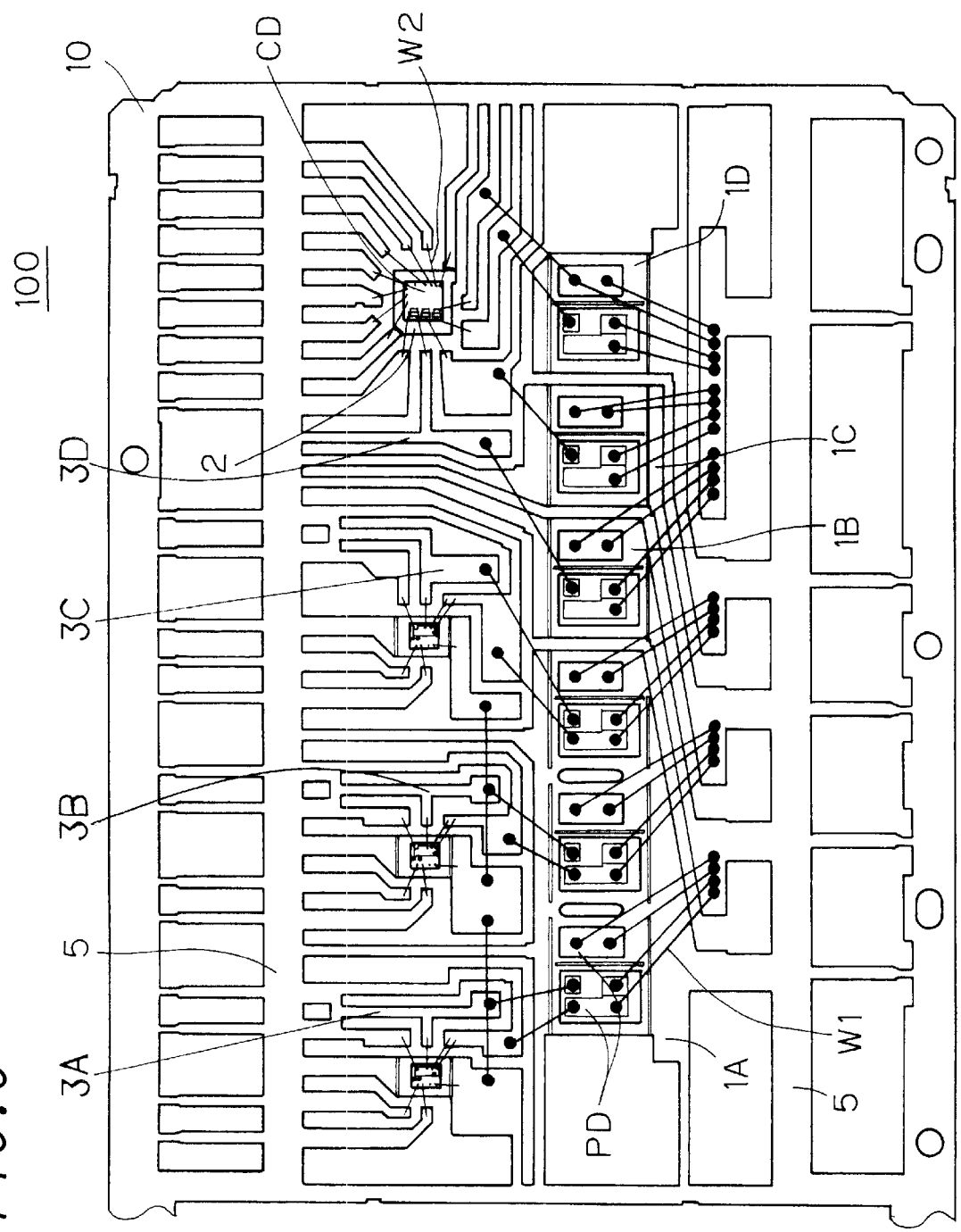
FIG. 3 is a diagram illustrating the structure of an IPM including the first and third characteristic parts according to the present invention.

A concrete structure of the IPM 100 comprising the aforementioned first to third characteristic parts is described with reference to FIG. 3 showing a fabrication step.

In FIG. 3, a lead frame 10 has power device die pads 1A to 1D and a plurality of control device die pads 2 which are connected to tie bars 5, and power devices PD are mounted on the power device die pads 1A to 1D while control devices CD are mounted on the control device die pads 2 and fixed by die bonding.

The power device die pads 1A to 1D and the control device die pads 2 are arranged on single sides of the lead frame respectively. Namely, the power device die pads 1 are arranged/formed on a slightly lower side with reference to the plane center and the control device die pads 2 are arranged/formed on a slightly upper side with reference to the plane center in FIG. 3.

In the lead frame 10, the power devices PD are electrically connected with prescribed portions on the lead frame 10 through aluminum wires W1, the control devices CD are electrically connected with prescribed portions on the lead frame 10 through gold wires W2, and packaging is completed. At this point, the device is so structured that the regions (first regions) where the aluminum wires W1 are arranged and the region (second region) where the gold wires W2 are arranged are not intermixed with each other.

In FIG. 3, intermediate leads 3A to 3D are formed in the vicinity of the control devices CD. The aluminum wires W1 extending from the power devices PD are connected and the gold wires W2 extending from the control devices CD are connected to the intermediate leads 3A to 3D, which serve as paths electrically connecting the power devices PD and the control devices CD with each other.

In FIG. 3, the aluminum wires W1 shown as perpendicularly intersecting with the intermediate leads 3A and 3B are formed to extend over the intermediate leads 3A and 3B.

While the IPM 100 is completed by performing transfer molding with respect to the lead frame 10 having the aforementioned structure to seal the power devices PD and the control devices CD with resin, description is omitted since the relation with the present invention is weak.

Figure 4:
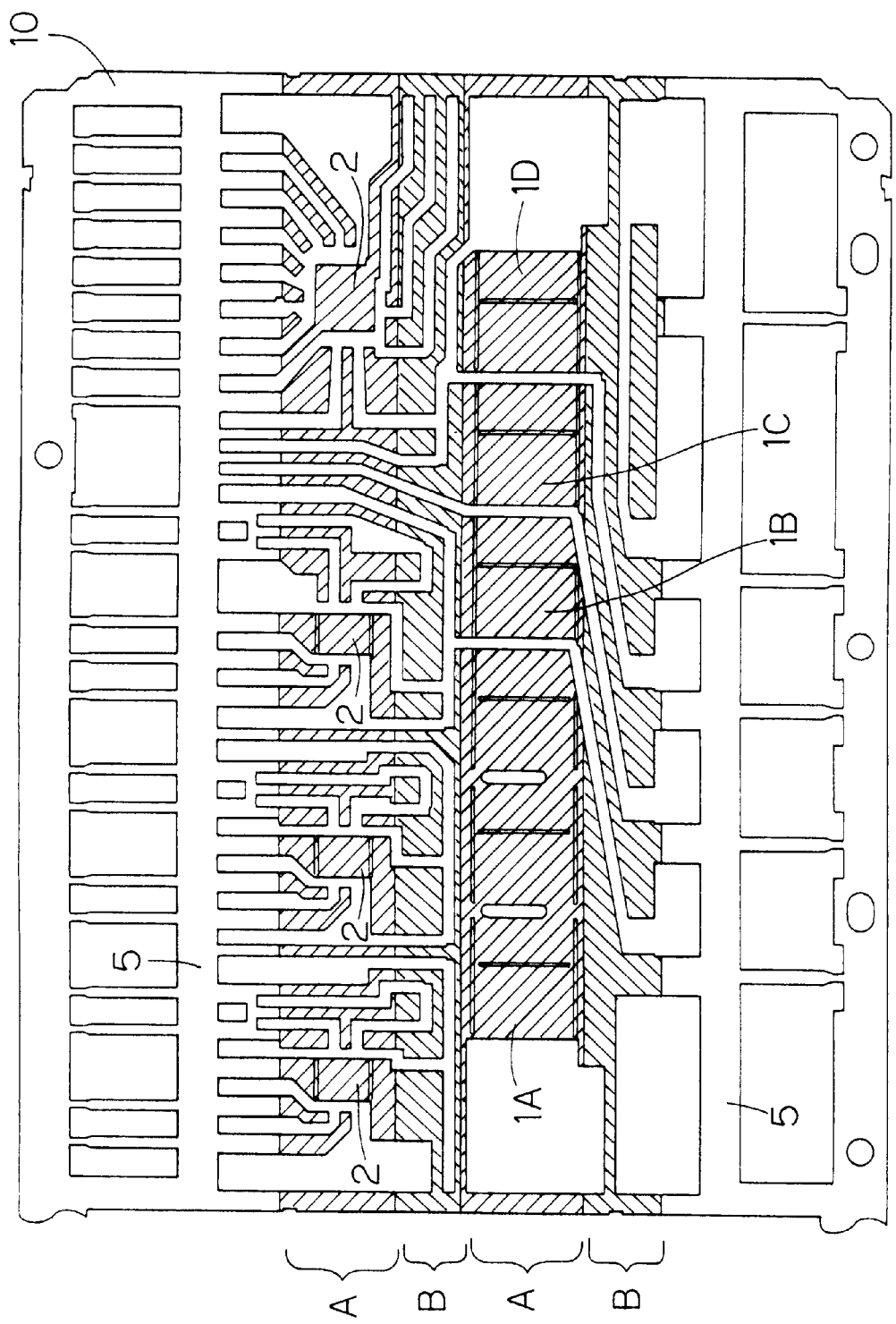
FIG. 4 is a diagram showing a concrete application example of the first characteristic part according to the present invention.

The first characteristic part is now specified with reference to FIG. 4. FIG. 4 shows the lead frame 10 before mounting the power devices PD and the control devices CD, and the region where the gold wires W2 are arranged and the region where the power devices PD are mounted are silver plating regions A. The regions where the aluminum wires W1 are arranged are nickel plating regions B.

The silver plating regions A and the nickel plating regions B are stripedly alternately provided, and both are not intermixed with each other. Formation of such striped plating is easy as compared with spot plating.

Namely, a copper plate serving as the material for the lead frame 10 is roll-shaped at first. While this is drawn out and worked into a plate and prescribed lead patterns are formed by punching, portions subjected to silver plating and portions subjected to nickel plating are distinguished by performing striped masks on the overall region of the copper plate of the material in advance of punching, for forming the silver plating regions A and the nickel plating regions B by prescribed plating steps.

More concretely, employed is a method of forming masks on regions not to be plated for performing nickel plating on the overall areas of the regions to be plated, then covering the regions to become the nickel plating regions B with striped masks and thereafter performing silver plating.

Thus, the shapes of the masks for performing plating are simple, sticking of the masks is easy and it is possible to perform plating over a wide range, whereby the workability is also excellent and the cost can be lowered.

Cutting, electric discharge machining, etching or the like may be used for formation of the prescribed lead patterns, in addition to punching.

Figure 5:
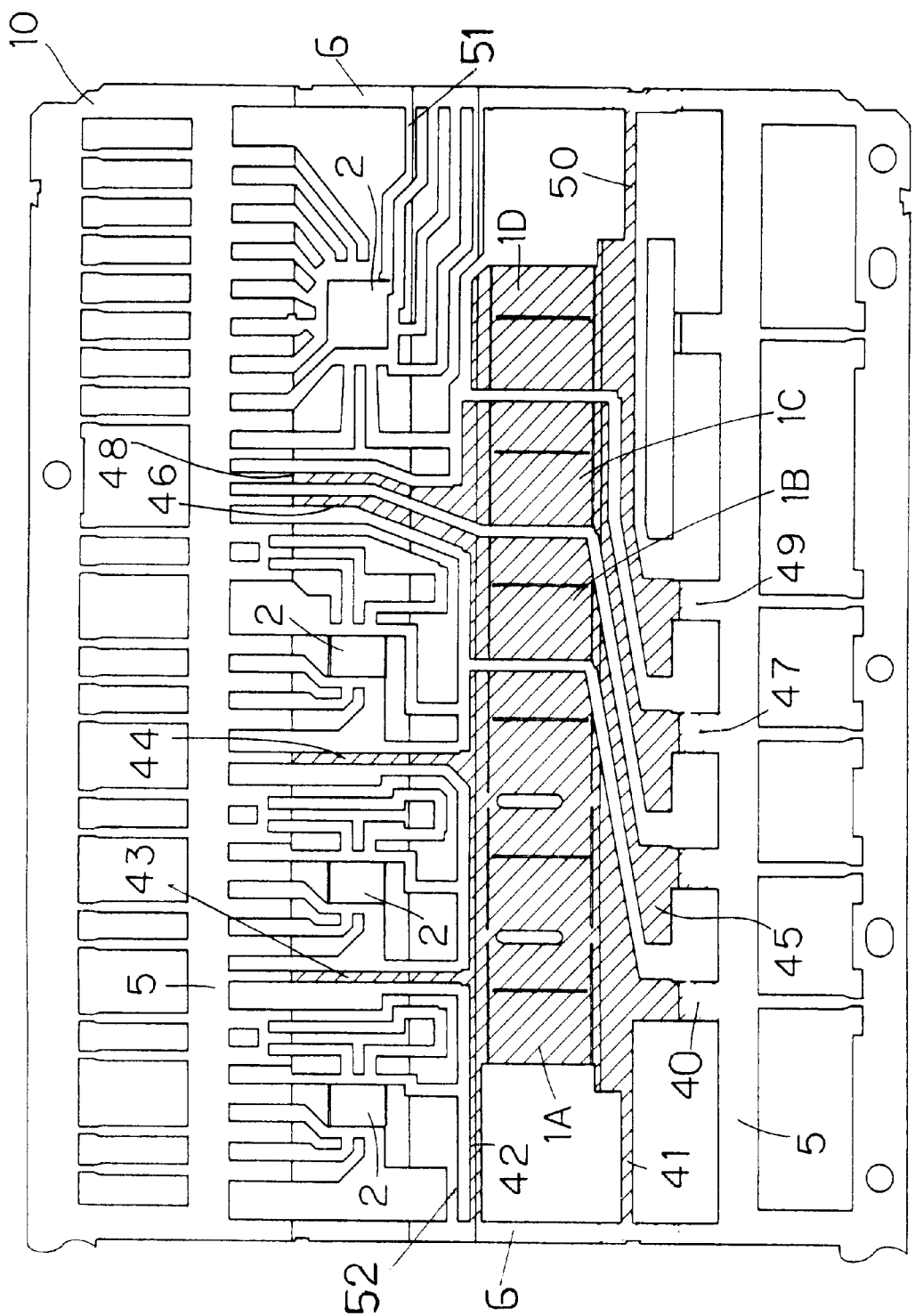
FIG. 5 is a diagram showing the second characteristic part according to the present invention, a concrete application example.

The second characteristic part is now specified with reference to FIG. 5. While FIG. 5 shows the lead frame 10 before mounting the power devices PD and the control devices CD, hatching specifying the silver plating regions A and the nickel plating regions B is omitted and hatching is performed on the power device die pads 1A to 1D and suspension leads (fixing pins) 40 to 50 supporting these.

The power device die pad 1A has a wide area since the same mounts three power devices PD as shown in FIG. 3. It is connected to the tie bars 5 and a frame 6 by the suspension leads 40 to 44 and supported. It comes to that the power device die pad 1A is supported in three directions, since the same is connected to the tie bar 5 on the lower side of the figure by the suspension lead 40, connected to the frame 6 on the left side of the figure by the suspension leads 41 and 42 and connected to the tie bar 5 on the upper side of the figure by the suspension leads 43 and 44. At this point, the suspension leads are strictly leads denoted by reference numerals 41 to 44, 46, 48 and 50, and leads denoted by reference numerals 40, 45, 47 and 49 are leads which integrate the power device die pads 1A to 1D with the lead frame 10 and are originally provided for serving also as current paths.

The power device die pad 1A can be thus supported in three directions, since the lead frame 10 is an integrated lead frame which is formed by punching plates of the same thickness and the same material.

Figure 6:
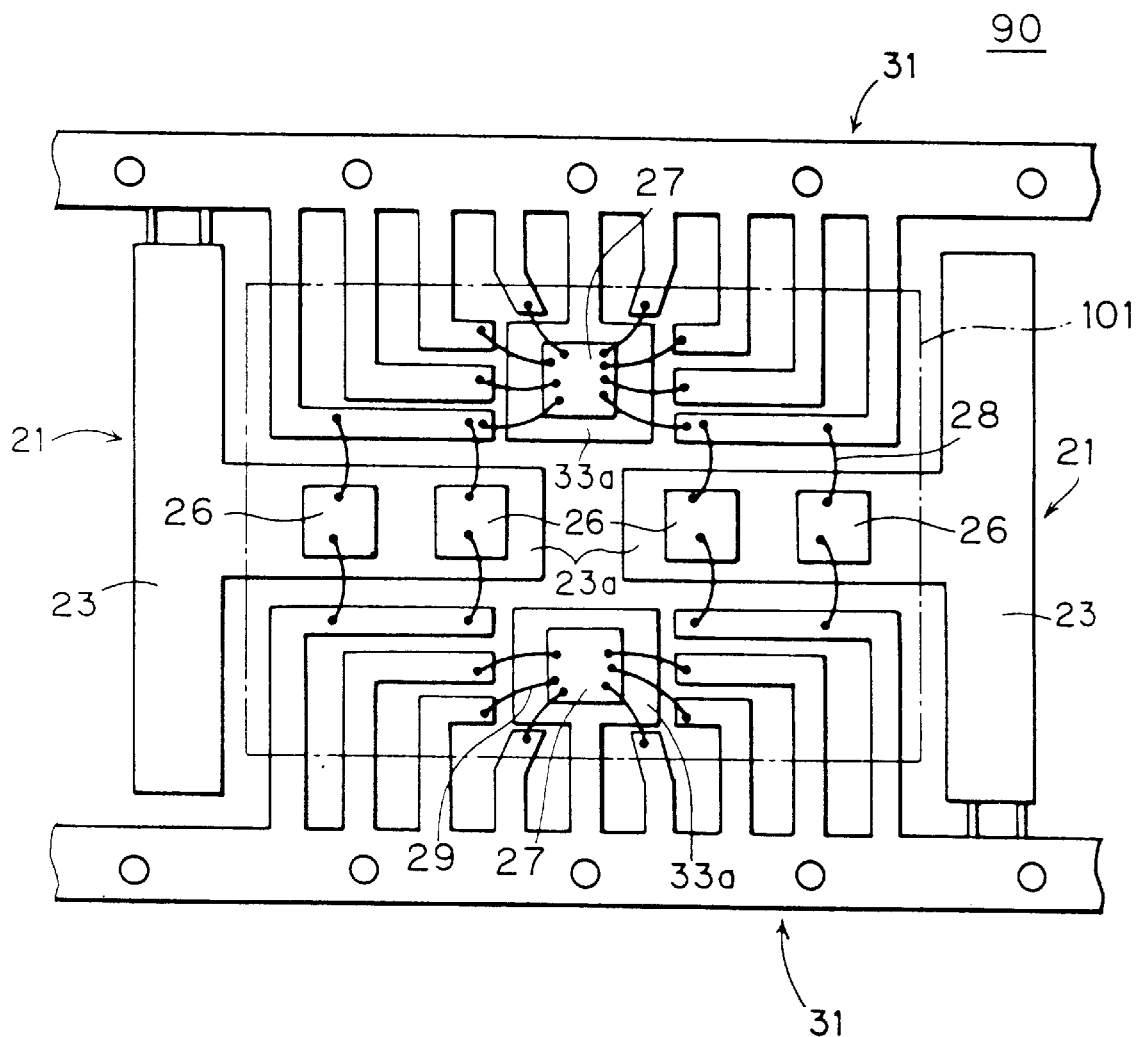
FIG. 6 is a diagram showing the structure of a conventional semiconductor device.

Namely, since opposite tie bars are independent of each other in the structure employing two lead frames in combination similarly to the conventional semiconductor device 90 described with reference to FIG. 6, suspension leads cannot be formed to be connected to both tie bars and the power device die pad cannot be supported in three directions. In the IPM 100 according to the present invention, on the other hand, the suspension leads can be connected to both of the opposite tie bars 5, whereby three-directional supporting becomes possible. If the power device die pad is only one, four-directional supporting is also possible.

Further, it comes to that the power device die pad 1B is supported in two directions, since the same is connected to the tie bar 5 on the lower side of the figure by the suspension lead 45 and connected to the tie bar 5 on the upper side of the figure by the suspension lead 46. Further, it comes to that the power device die pad 1C is supported in two directions, since the same is connected to the tie bar 5 on the lower side of the figure by the suspension lead 47 and connected to the tie bar 5 on the upper side of the figure by the suspension lead 48. Further, it comes to that the power device die pad 1D is supported in two directions, since the same is connected to the tie bar 5 on the lower side of the figure by the suspension lead 49 and connected to the frame 6 on the right side of the figure by the suspension lead 50.

The tie bars 5 are parts of the lead frame 10, and may be treated as frames similarly to the frames 6.

Thus, the power device die pads 1A to 1D are supported in three directions or two directions, whereby the same are prevented from deflection in case of mounting the power devices PD, and a bonding operation for the power devices PD and a transport operation after wire bonding become easy.

While the control device die pads 2 comprise the suspension leads 51 and 52 shown in FIG. 5 and are supported in two directions as to the two positioned on the endmost portions of the arrangement, the remaining control device die pads 2 are supported only in one direction. The control devices CD are small as compared with the power devices PD and light in weight, and hence there is no problem in particular.

We claim:
1. A semiconductor device comprising:
   a lead frame; and
   a power device and a control device controlling said power device, being arranged on said lead, frame, wherein
   said power device is arranged in a first region on said lead frame,
   said control device is arranged in a second region on said lead frame,
   said first region and said second region are divided and isolated from each other,
   said power device is electrically connected to said lead frame in said first region through a plurality of first wires,
   said control device is electrically connected to said lead frame in said second region through a plurality of second wires being thinner than said first wires, and
   said lead frame is characterized in that
   at least a region to which said first wires are connected is a striped first plating region being subjected to plating of a first material with a constant width along a prescribed direction of said lead frame, and
   at least a region to which said second wires are connected is a striped second plating region being subjected to plating of a second material with a constant width along said prescribed direction of said lead frame.

2. The semiconductor device in accordance with claim 1, wherein said lead frame is
   an integrated lead frame being formed by performing a prescribed lead pattern on plates of the same thickness and the same material.

3. The semiconductor device in accordance with claim 2, wherein said first and second plating regions are formed before formation of said prescribed lead pattern.

4. The semiconductor device in accordance with claim 1, wherein said lead frame comprises:

an intermediate lead being independent of a lead performing electrical connection between said power device and said control device and the device exterior, and said intermediate lead serves as a path through which another end of said first wires whose one end is connected to said control device and another end of said second wires whose one end is connected to said power device are connected with each other for electrically connecting said control device and said power device.

5. The semiconductor device in accordance with claim 1, wherein said lead frame comprises:

at least one power device die pad mounting said power device, and at least one control device die pad mounting said control device, and said at least one power device die pad and at least one said control device die pad further comprise suspension leads connecting said at least one power device die pad and at least one said control device die pad to said lead frame and supporting the same in addition to leads originally comprised for connecting the respective ones and said lead frame.

6. The semiconductor device in accordance with claim 5, wherein said lead frame comprises:

four frames defining a rectangular region, said at least one power device die pad is a plurality of power device die pads being arranged in a line, and a power device die pad being positioned on an end portion among said plurality of power device die pads is connected to three among said four frames by said originally comprised leads and said suspension leads.

* * * * *